(12) United States Patent  
Zhang et al.

(10) Patent No.: US 9,190,323 B2
(45) Date of Patent: Nov. 17, 2015

(54) SEMICONDUCTOR DEVICES WITH COPPER INTERCONNECTS AND METHODS FOR FABRICATING SAME

(75) Inventors: Xunyuan Zhang, Troy, NY (US); Hoon Kim, Guilderland, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 651 days.

(21) Appl. No.: 13/354,070

(22) Filed: Jan. 19, 2012

(65) Prior Publication Data

US 2013/0187273 A1 Jul. 25, 2013

(51) Int. Cl.
*H01L 23/52* (2006.01)
*H01L 21/768* (2006.01)
*H01L 23/532* (2006.01)

(52) U.S. Cl.
CPC .... *H01L 21/76885* (2013.01); *H01L 21/76838* (2013.01); *H01L 21/76852* (2013.01); *H01L 23/53238* (2013.01); *H01L 21/76849* (2013.01); *H01L 2924/0002* (2013.01)

(58) Field of Classification Search
None
See application file for complete search history.

(56) References Cited

U.S. PATENT DOCUMENTS

| 4,448,633 | A * | 5/1984 | Shuskus ............... | 438/767 |
| 4,810,332 | A * | 3/1989 | Pan ..................... | 205/125 |
| 5,164,332 | A * | 11/1992 | Kumar ................ | 438/653 |
| 5,350,484 | A * | 9/1994 | Gardner et al. ...... | 438/669 |
| 6,972,453 | B2 * | 12/2005 | Ohtake et al. ........ | 257/314 |
| 8,492,897 | B2 * | 7/2013 | Cabral et al. ........ | 257/751 |
| 8,592,303 | B2 * | 11/2013 | Tada et al. ........... | 438/637 |
| 8,704,372 | B2 * | 4/2014 | Ryan et al. .......... | 257/750 |
| 2002/0102834 | A1 * | 8/2002 | Yang .................. | 438/618 |
| 2002/0155639 | A1 * | 10/2002 | Ohtake et al. ....... | 438/118 |
| 2003/0116439 | A1 * | 6/2003 | Seo et al. ............ | 205/125 |
| 2005/0093166 | A1 * | 5/2005 | Higashi et al. ...... | 257/774 |
| 2005/0186738 | A1 | 8/2005 | Hofmann et al. | |
| 2006/0060976 | A1 | 3/2006 | Caubet et al. | |
| 2007/0148336 | A1 * | 6/2007 | Bachrach et al. .... | 427/97.1 |
| 2007/0194287 | A1 * | 8/2007 | Dominguez et al. . | 252/500 |
| 2007/0197012 | A1 | 8/2007 | Yang et al. | |
| 2008/0150137 | A1 * | 6/2008 | Liu et al. ............. | 257/751 |
| 2009/0117731 | A1 * | 5/2009 | Yu et al. .............. | 438/627 |

(Continued)

FOREIGN PATENT DOCUMENTS

JP 2011023456 A 2/2011
TW 201123334 A 7/2011

OTHER PUBLICATIONS

Hojabri, A., N. Haghighian, K. Yasserian, and M. Ghoranneviss. "The Effect of Nitrogen Plasma on Copper Thin Film Deposited by DC Magnetron Sputtering." IOP Conference Series: Materials Science and Engineering 12 (2010): 012004.*

(Continued)

*Primary Examiner* — Joseph Schoenholtz
(74) *Attorney, Agent, or Firm* — Ingrassia Fisher & Lorenz, P.C.

(57) ABSTRACT

Semiconductor devices having copper interconnects and methods for their fabrication are provided. In one embodiment, a semiconductor device is fabricated with a copper interconnect on substrate such as an FEOL processed substrate. The method includes forming a copper layer on a substrate. The copper layer is formed from grains. The copper layer is modified such that the modified copper layer has an average grain size of larger than about 0.05 microns. In the method, the modified copper layer is etched to form a line along the substrate and a via extending upwards from the line.

17 Claims, 8 Drawing Sheets

(56) References Cited

U.S. PATENT DOCUMENTS

| | | | | |
|---|---|---|---|---|
| 2009/0137106 | A1* | 5/2009 | Nunan | 438/524 |
| 2009/0206484 | A1 | 8/2009 | Baker-O'Neal et al. | |
| 2009/0256261 | A1* | 10/2009 | Noguchi et al. | 257/760 |
| 2009/0280636 | A1* | 11/2009 | Hsu et al. | 438/618 |
| 2009/0289366 | A1 | 11/2009 | Watanabe et al. | |
| 2010/0025852 | A1 | 2/2010 | Ueki et al. | |
| 2011/0062587 | A1 | 3/2011 | Yang et al. | |
| 2011/0175226 | A1* | 7/2011 | Bonilla et al. | 257/751 |
| 2011/0254164 | A1* | 10/2011 | Gordon et al. | 257/751 |
| 2011/0281431 | A1 | 11/2011 | Witt | |
| 2011/0285024 | A1* | 11/2011 | Tsumura et al. | 257/773 |
| 2013/0252417 | A1 | 9/2013 | Ishizaka et al. | |

OTHER PUBLICATIONS

Chung, Chia-Jeng, David P. Field, No-Jin Park, and Ross G. Johnson. "Simulation of Structure Evolution in Cu Films." Thin Solid Films 517.6 (2009): 1977-982.*
Onuki, Jin, Kunihiro Tamahashi, Takashi Namekawa, and Yasushi Sasajima. "Impact of High Heating Rate, Low Temperature, and Short Time Annealing on the Realization of Low Resistivity Cu Wire." Materials Transactions 51.9 (2010): 1715-717.*
Park, N. -J., D. P. Field, M. M. Nowell, and P. R. Besser. "Effect of Film Thickness on the Evolution of Annealing Texture in Sputtered Copper Films." Journal of Electronic Materials 34.12 (2005): 1500-508.*
Arkalgud, Sitaram. 3D Interconnects, Annual Sematech Symposium, Seoul, Oct. 27, 2011.*
Lu, Qian, Xin Zhang, Wei Zhu, Yongning Zhou, Qianfei Zhou, Lilong Liu, and Xiaojing Wu. "Reproducible Resistive-switching Behavior in Copper-nitride Thin Film Prepared by Plasma-immersion Ion Implantation." Physica Status Solidi (a) 208.4 (2011): 874-77.*
Gupta, D, Plasma Immersion Ion Implantation (PIII) process-physics and Technology', International Journal of Advancements in Technology, vol. 2, No. 4 (2011) pp. 471-490.*
Definition of pillar downloaded from URL< http://www.merriam-webster.com/dictionary/pillar > on Nov. 22, 2014.*
Discussion of 'integrally formed' downloaded from URL < http://www.intelproplaw.com/Forum/Forum.cgi?board=patent_drafting;action=display;num=1137013125 > on Nov. 22, 2014.*
Definition of integral downloaded from URL http://dictionary.reference.com/browse/integrally >on Nov. 22, 2014.*
Park, N.-J., D. P. Field, M. M. Nowell, and P. R. Besser. "Effect of Film Thickness on the Evolution of Annealing Texture in Sputtered Copper Films." Journal of Electronic Materials 34.12 (2005): 1500-508.*
Hara, Tohru, Kohji Sakata, and Yuji Yoshida. "Control of the (111) Orientation in Copper Interconnection Layer." Electrochemical and Solid-State Letters 5.3 (2002): C41.*
Casey, Patrick, Justin Bogan, Anthony Mccoy, Juan G. Lozano, Peter D. Nellist, and Greg Hughes. "Chemical and Structural Investigations of the Interactions of Cu with MnSiO3 Diffusion Barrier Layers." Journal of Applied Physics 112.6 (2012): 064507.*
Casey, Patrick. Growth and Chemical Characterisation Studies of Mn Silicate Barrier Layers on SiO2 and CDO. Thesis. Dublin City University, 2012. Dublin: School O Physical Sciences, 2012.*
Bogan, Justin. Growth and Chemical Characterisation Studies of Mn Silicate Barrier Layers on SiO2 and CDO. Thesis. Dublin City University, 2012. Dublin: School of Physical Sciences, 2012.*
Cho, Yong Chan, Seunghun Lee, Muhammad Ajmal, Won-Kyung Kim, Chae Ryong Cho, Se-Young Jeong, Jeung Hun Park, Sang Eon Park, Sungkyun Park, Hyuk-Kyu Pak, and Hyoung Chan Kim. "Copper Better than Silver: Electrical Resistivity of the Grain-Free Single-Crystal Copper Wire." Crystal Growth & Design 10.6 (2010): 2780-784.*
Casey, P., J. Bogan, J. G. Lozano, P. D. Nellist, and G. Hughes. "Chemical and Structural Investigation of the Role of Both Mn and Mn Oxide in the Formation of Manganese Silicate Barrier Layers on SiO2." Journal of Applied Physics 110.5 (2011): 054507.*
German Office Action mailed May 3, 2013 in German Patent Application No. 10 2012 216 153.8.
State Intellectual Property Office of the Peoples' Republic of China, Office Action in Chinese Patent Application No. 201310017487.X, mailed Jul. 29, 2014.
The Intellectual Property Office, Examination Report for Taiw. (089. 0194TW). X.
Korean Intellectual Property Office, Notice of Office Action for Korean Patent Application No. 10-2012-0107447 mailed May 29, 2015.
State Intellectual Property Office of the People'S Republic of China, Office Action for Chinese Patent Application No. 201310017487.X mailed Feb. 12, 2015.
State Intellectual Property Office of the People'S Republic of China, Office Action for Chinese Patent Application No. 201310017487.X mailed May 18, 2015.

* cited by examiner

SEMICONDUCTOR DEVICES WITH COPPER INTERCONNECTS AND METHODS FOR FABRICATING SAME

TECHNICAL FIELD

The present disclosure generally relates to semiconductor devices with copper interconnects and to methods for their fabrication, and more particularly relates to semiconductor devices with copper interconnects having low electrical resistivity and methods for fabricating such semiconductor devices.

BACKGROUND

Generally, integrated circuits comprise electronic components, such as transistors, capacitors, and the like, formed on and within a wafer. One or more metal layers are formed over the electronic components to provide connections between the electronic components and to provide connections to external devices. Typically, an interlayer dielectric material is deposited, and interconnect structures, such as vias and lines, are formed in the dielectric material, usually through a single- or dual-damascene process.

The trend in the semiconductor industry is towards the miniaturization or scaling of integrated circuits, in order to provide smaller integrated circuits and improved performance, such as increased speed and decreased power consumption. While aluminum and aluminum alloys were most frequently used in the past for the material of conductive lines in integrated circuits, the current trend is to use copper for a conductive material because copper has better electrical characteristics than aluminum, such as higher conductivity, and a higher melting point.

One issue with copper interconnects is that the copper exhibits increased electrical resistivity as the feature sizes of the copper lines or copper vias are decreased below 75 nm. A large fraction of the increased resistivity is believed to be due to the small grain or crystallite size (typically less than about 0.02 microns). Scattering at grain boundaries increases resistance in metals. In order to grow grains within copper lines and copper vias, methods have been implemented to deposit grain growth promotion layers and/or plating seed layers before depositing copper. However, the processes associated with these methods can degrade the functionality of the dielectric material, resulting in leakage and/or an increase in k value. Also, voids in the lines and vias may be created during these processes. Further, these processes may leave small grains in the deeper portions, increasing electromigration.

Accordingly, it is desirable to provide copper interconnects for semiconductor devices with reduced resistivity and increased resistance to electromigration, and methods for fabricating such copper interconnects. In addition, it is desirable to provide interconnects and methods for fabricating interconnects with copper lines having increased grain size and a bamboo microstructure. Furthermore, other desirable features and characteristics will become apparent from the subsequent detailed description and the appended claims, taken in conjunction with the accompanying drawings and the foregoing technical field and background.

BRIEF SUMMARY

Semiconductor devices having copper interconnects and methods for their fabrication are provided. In accordance with one embodiment, a semiconductor device with a copper interconnect is fabricated on substrate such as a front end of line (FEOL) processed substrate. The method includes forming a copper layer on a substrate. The copper layer is formed from grains and is modified such that the modified copper layer has an average grain size of larger than about 0.05 microns. In the method, the modified copper layer is etched to form a line along the substrate and a via extending upwards from the line.

In accordance with another embodiment, a method for fabricating a semiconductor device with a copper interconnect is provided. The method forms a copper layer on a FEOL processed substrate. The copper layer is annealed and grains within the copper layer are grown to form a bamboo microstructure. In the method, the annealed copper layer is etched to form a line along the substrate and a via, formed from a single crystal and extending upwards from the line. A dielectric material is deposited overlying the line and surrounding the via.

In another embodiment, a copper interconnect fabricated on an FEOL processed substrate is provided. The copper interconnect includes a first copper layer composed of a copper line and a copper via. The copper line is formed on the FEOL processed substrate and has an average grain size of larger than about 0.05 microns. The copper via is formed integrally with the copper line and extends upward from the copper line at an angle of about 90 degrees. The copper via has a top surface and side surfaces and is formed from a single crystal. The copper interconnect further includes a barrier layer on the copper line and on the side surfaces of the via. The barrier layer is cobalt, titanium, ruthenium, tantalum nitride, or manganese or combinations thereof. In the copper interconnect, a dielectric material overlies the FEOL processed substrate and the barrier layer on the copper line, and surrounds the barrier layer on the copper via. An interlayer barrier is provided over the dielectric material. Also, the copper interconnect includes a second copper layer formed from copper overlying the copper via and the interlayer barrier.

BRIEF DESCRIPTION OF THE DRAWINGS

The copper interconnect and methods of fabrication will hereinafter be described in conjunction with the following drawing figures, wherein like numerals denote like elements, and wherein.

DETAILED DESCRIPTION

The following detailed description is merely exemplary in nature and is not intended to limit the copper interconnect, or the fabrication methods, applications or uses of the copper interconnect. Furthermore, there is no intention to be bound by any expressed or implied theory presented in the preceding technical field, background or brief summary, or in the following detailed description.

In accordance with the various embodiments herein, methods for fabricating a copper interconnect for a semiconductor device utilize the growth of grains or crystallites to sizes larger than about 0.05 microns, such as about 0.10 microns. As a result of grain growth, the copper lines have a bamboo microstructure. In the semiconductor industry, "bamboo microstructures" refers to narrow wires that have perpendicular grain boundaries, i.e., at right angles to the current, reminiscent of nodes in bamboo culms. Because grain boundaries in bamboo microstructures are perpendicular to the current, the boundary diffusion factor is excluded, and material transport is correspondingly reduced. Further, larger grains necessarily form fewer grain boundaries in a given length of a copper line, resulting in a lower likelihood of electromigration effects.

FIGS. 1-16 illustrate various embodiments of copper interconnects and method steps for fabricating such copper interconnects on a substrate such as a front end of line (FEOL) processed wafer. Although the subject matter is described herein in the context of a copper interconnect, the subject matter is not intended to be limited to pure copper, and some embodiments may utilize copper alloys formed with copper and up to 10% other metals such as Mn, Al, Sn, Cr, Co, Ru, Si, and/or W. For convenience, but without limitation, such copper alloys as well as pure copper will be referred to herein collectively as "copper." Various steps in the fabrication of a semiconductor device with a copper interconnect are well known and so, in the interest of brevity, many conventional steps will only be mentioned briefly herein or will be omitted entirely without providing the well known process details.

Figure 1:
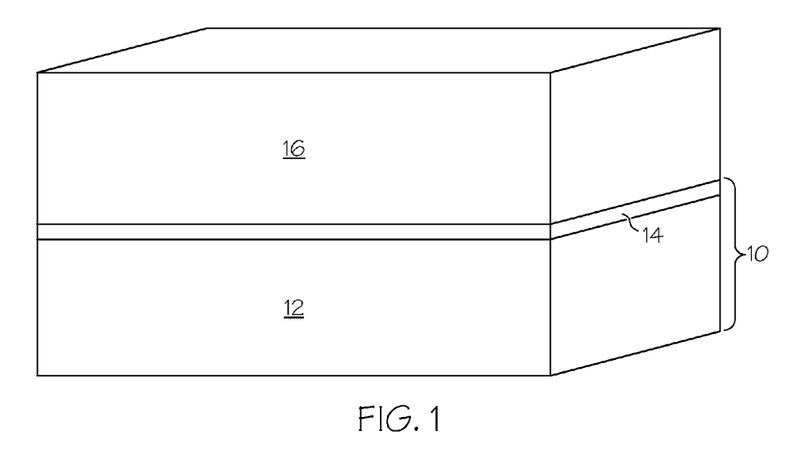
FIG. 1 is a perspective view of a copper layer formed on a substrate during fabrication of a semiconductor device with a copper interconnect in accordance with various embodiments herein.

Turning now to FIG. 1, in an exemplary embodiment, the fabrication process begins by performing FEOL processing to form a substrate 10. As a FEOL processed wafer, the substrate 10 can include any of the devices typically formed by FEOL processing, such as logic cells, transistors, diodes, and the like, surrounded by an insulator material 12 formed from oxide, nitride, or other dielectric. The method includes depositing a diffusion barrier layer 14 onto the substrate 10. In an exemplary embodiment, the diffusion barrier layer 14 is silicon nitride or manganese silicide, and the diffusion barrier layer 14 is formed by chemical vapor deposition (CVD) of silicon nitride or manganese silicide. The diffusion barrier layer 14 is formed to inhibit diffusion of copper into the insulator material 12. In some embodiments, the diffusion barrier layer 14 may be considered to be part of the substrate 10. Other embodiments may avoid deposition and use of the diffusion barrier layer 14.

As shown in FIG. 1, a copper layer 16 is deposited over the substrate 10. Specifically, the copper layer 16 is deposited by physical vapor deposition (PVD) onto the diffusion barrier layer 14. The copper layer 16 deposited by PVD has a preferential crystal orientation of (111). After the PVD process, the method provides for annealing the copper layer 16, such as by regular furnace annealing at a temperature of about 100-350 degree C. for about 1 hour, with an ambient of inert gas or a mixture of inert gas and hydrogen. The ambient should be nearly oxygen-free, i.e., contain less than about 100 ppm oxygen. As a result of the anneal, the copper layer 16 is modified by the growth of grains therein such that the average grain size is larger than about 0.05 microns, such as about 0.1 microns.

Figure 2:
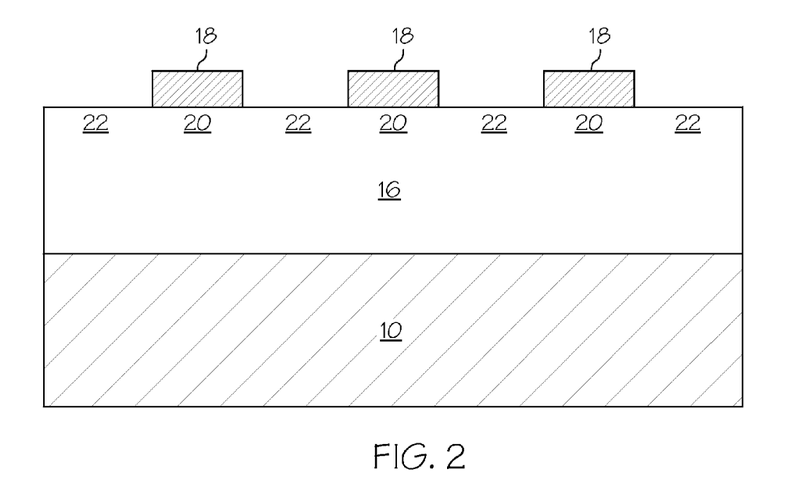
FIGS. 2-4 illustrate, in cross section, masking and nitridation steps for forming a copper interconnect from the copper layer of FIG. 1 in accordance with various embodiments herein.
Figure 3:
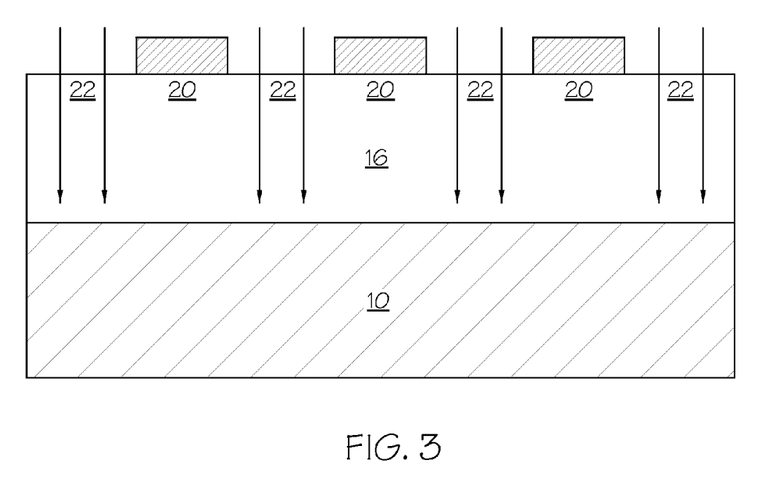
Figure 4:
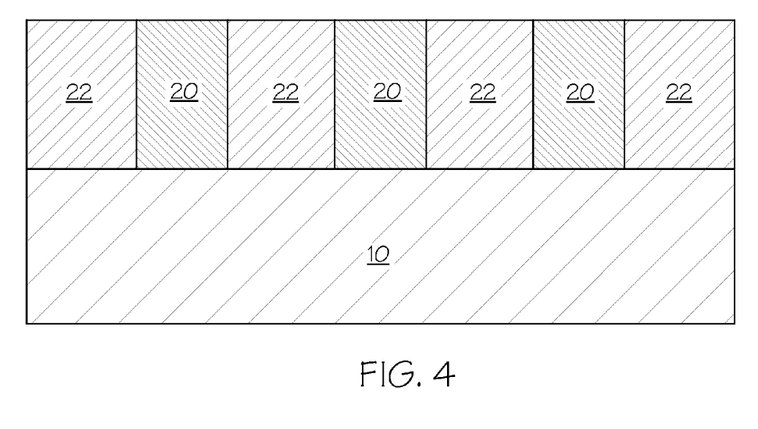

As shown in FIG. 2, after annealing the copper layer 16, a masking material is formed over the copper layer 16 and is lithographically patterned into line masks 18. The line masks 18 define masked areas 20 and unmasked areas 22 of the copper layer 16. The copper layer 16 is then nitrided as shown in FIG. 3. Specifically, nitrogen plasma ion implantation is used to nitride the unmasked areas 22 of the copper layer 16. The nitridation stops at the substrate 10. The line masks 18 are then removed, as shown in FIG. 4, leaving masked areas 20 and unmasked/nitrided areas 22.

Figure 5:
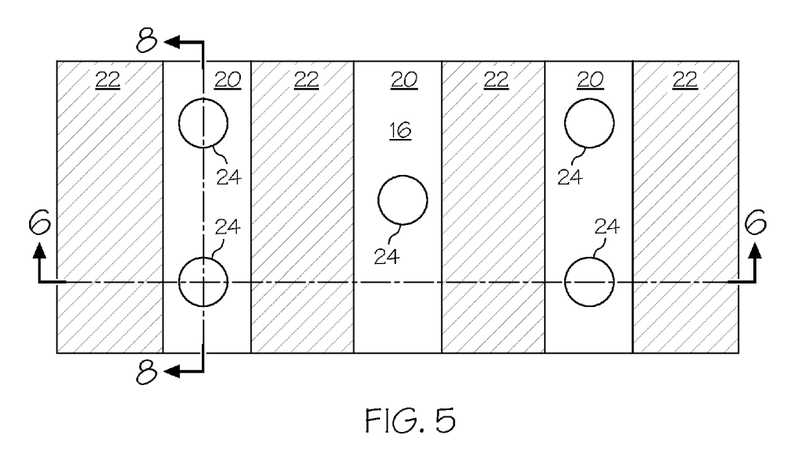
FIG. 5 is a top view of the copper layer of FIG. 1 after partial nitridation and after via mask patterning in accordance with various embodiments.
Figure 6:
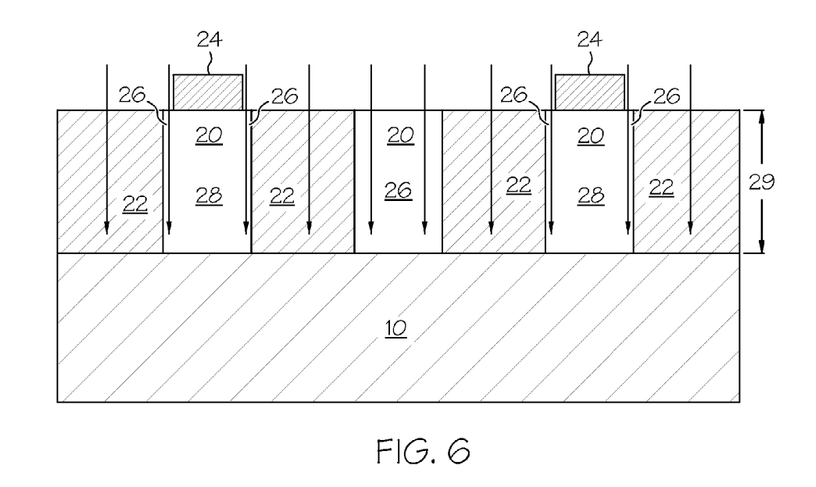
FIG. 6 is a cross-sectional view, taken along line 6-6 of FIG. 5, illustrating the nitridation of the copper layer to form copper vias and copper lines from the copper layer in accordance with various embodiments.
Figure 7:
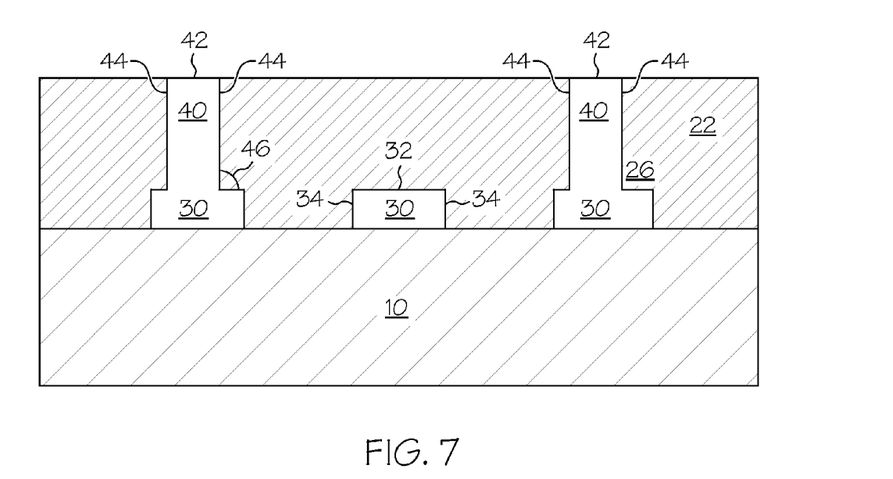
FIG. 7 is a cross-sectional view, also taken along line 6-6 of FIG. 5, illustrating the copper vias and copper lines formed by nitridation of the copper layer after mask removal in accordance with various embodiments.
Figure 8:
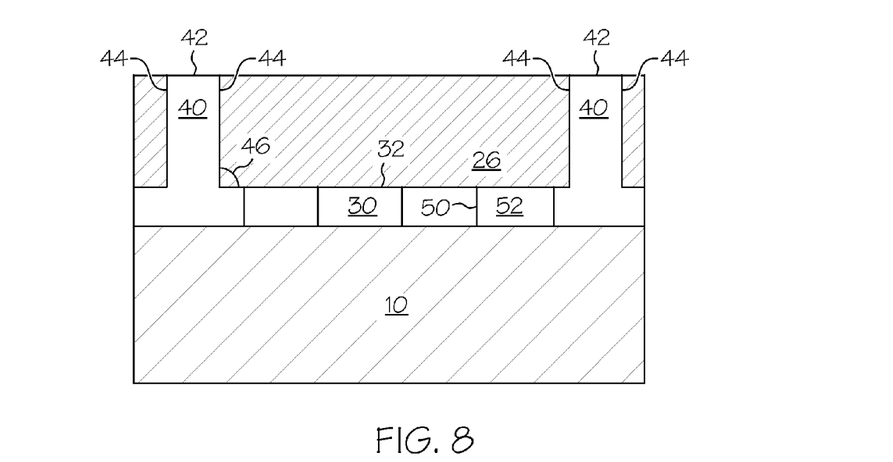
FIG. 8 is a cross-sectional view of the copper interconnect at the same stage as FIG. 7, but taken along line 8-8 of FIG. 5, in accordance with various embodiments.

FIG. 5 is an overhead view of the copper layer 16 after removal of the line mask 18 and after forming and lithographically patterning via masks 24. As shown in FIG. 5, the via masks 24 are substantially circular and are positioned over the previously masked areas 20, thereby defining unmasked portions 26 of areas 20 and masked portions 28 of areas 20 shown in FIG. 6. FIG. 6 illustrates that the copper layer 16 is then nitrided again, such as by nitrogen plasma ion implantation. However, the nitridation process is controlled to nitride the unmasked portions 26 to a selected depth 29. As a result, copper lines 30 are formed and have top surfaces 32 and side surfaces 34 as shown in FIGS. 7 and 8 after the via mask 24 has been removed. Further, copper vias 40 are formed with a top surface 42 and side surfaces 44. FIGS. 7 and 8 illustrate that the copper vias 40 are formed integrally with the copper lines 30 and define an intersection angle 46 between the copper vias 40 and the copper lines 30 of about 90 degrees. Further, FIGS. 7 and 8 show that the copper vias 40 extend upwards from the copper lines 30. Also, FIG. 8 illustrates that the copper line 30 is formed with a bamboo structure, having grain boundaries 50 substantially perpendicular to the copper line 30. In the exemplary embodiment, the copper vias 40 are substantially formed from single crystals and include substantially no grain boundaries. This is possible because the via is smaller than the size of the grains.

Figure 9:
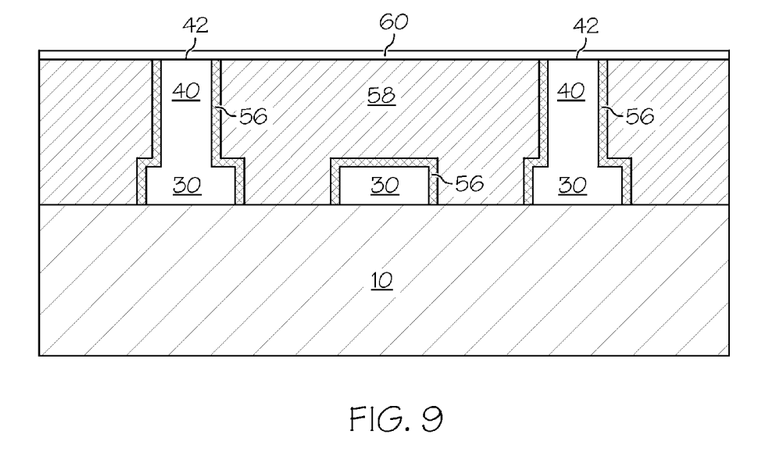
FIGS. 9 and 10 are cross-sectional views similar to FIG. 7, after further processing to form the copper interconnect in accordance with various embodiments.

After formation of the copper lines 30 and copper vias 40, the nitrided copper in unmasked area 22 and unmasked portion 26 is wet etched by immersion in a hydrochloric (HCl) acid solution. The HCl selectively etches the copper nitride 22, 26 without attacking the copper line 30 and copper via 40. As shown in FIG. 9, a barrier layer 56 is formed on the top and side surfaces 32, 34 of the copper line 30, and on the top and side surfaces 42, 44 of the copper via 40. For example, a conformal thin barrier layer 56 of cobalt, titanium, ruthenium, tantalum nitride, or manganese or the combinations of these materials can be selectively deposited onto the surfaces of the copper line 30 and copper via 40, such as by atomic layer deposition (ALD) or CVD. As is known, there are methods for metal film selective deposition on Cu, such as Mn selective growth on Cu, such as those described in "Selective Chemical Vapor Deposition of Manganese Self-Aligned Capping Layer for Cu Interconnections in Microelectronics" by Au, Yeung; Lin, Youbo; Kim, Hoon; Beh, Eugene; Liu, Yiqun;

Gordon, Roy G. in the *Journal of the Electrochemical Society* (2010) 157:D341-D345). After the barrier layer 56 is formed over the copper, a dielectric material 58 is deposited onto the substrate 10, overlying and surrounding the copper lines 30 and copper vias 40. The dielectric material 58 is planarized by chemical-mechanical planarization (CMP) down to the top surface 42 of the copper vias 40.

Figure 10:
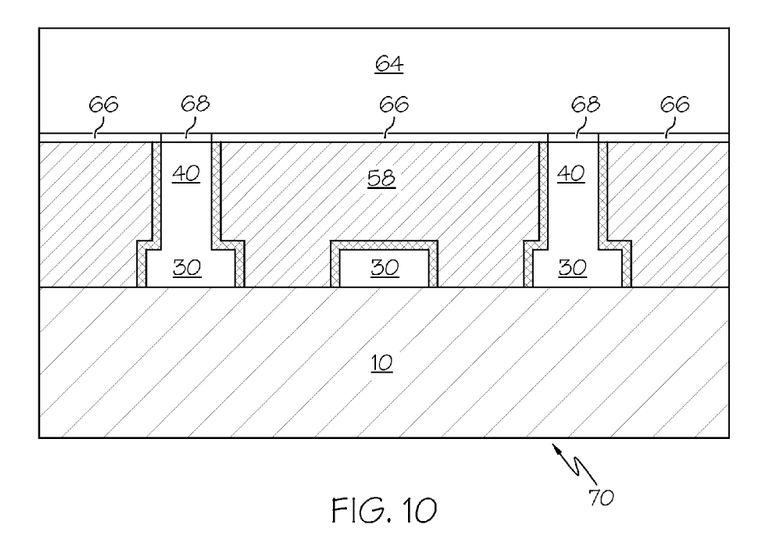

As shown in FIG. 9, an interlayer material 60 is formed over the dielectric material 58 and the top surfaces 42 of the copper vias 40. Then, as illustrated in FIG. 10, a second copper layer 64 is deposited, such as by PVD, and is annealed, thereby growing the grains to provide the desired average grain size. In one embodiment, the interlayer material 60 is manganese, and the annealing process causes the portion 66 of the manganese material 60 over the dielectric material 58 to form into manganese silicate. However, the portion 68 of the manganese material 60 over the copper vias 40 remains metallic manganese.

Figure 11:
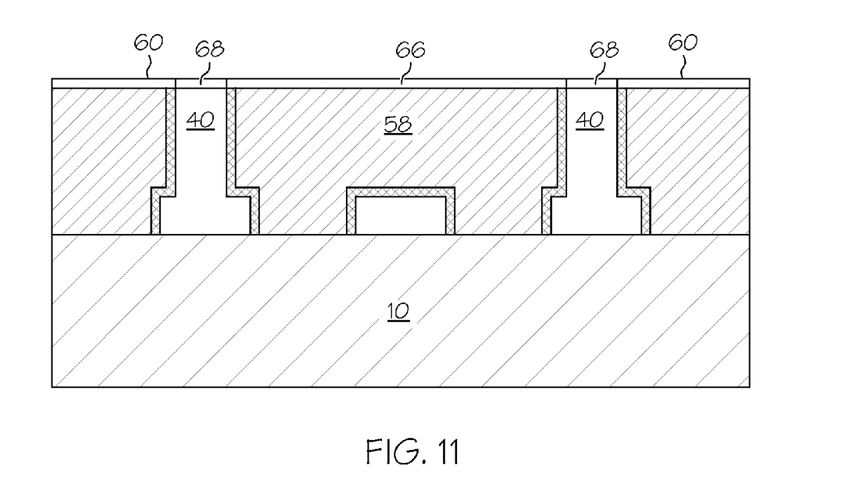
FIG. 11 is a cross-section view showing an alternate process for forming an interlayer material, in accordance with various embodiments.

FIG. 11 illustrates an alternate process for growing the interlayer material 60. After wet etching the nitrided copper in unmasked area 22 and unmasked portion 26, forming the barrier layer 56, depositing the dielectric material 58, and planarizing the dielectric material 58, a selective growth process is used to form the portion 68 of interlayer material 60 over the copper vias 40. For instance, manganese material may be deposited by ALD or CVD at conditions preferential to a high growth rate on copper to form the cap portions 68. Then another interlayer material 60 is deposited over the dielectric material 58 and cap portion 68, and is planarized, such as by CMP, down to the cap portion 68 to form portions 66 as shown in FIG. 11. The interlayer material 60 forming portions 66 is formed from a material that serves as a diffusion barrier (similar to the function served by manganese silicate in the embodiment illustrated in FIG. 10) such as silicon nitride. Depositing the copper layer 64 over the structure shown in FIG. 11 then forms the structure previously shown in FIG. 10. The same processing of copper layer 16 can be performed on copper layer 64, and so on; to form multiples copper layers in the copper interconnect 70.

Figure 12:
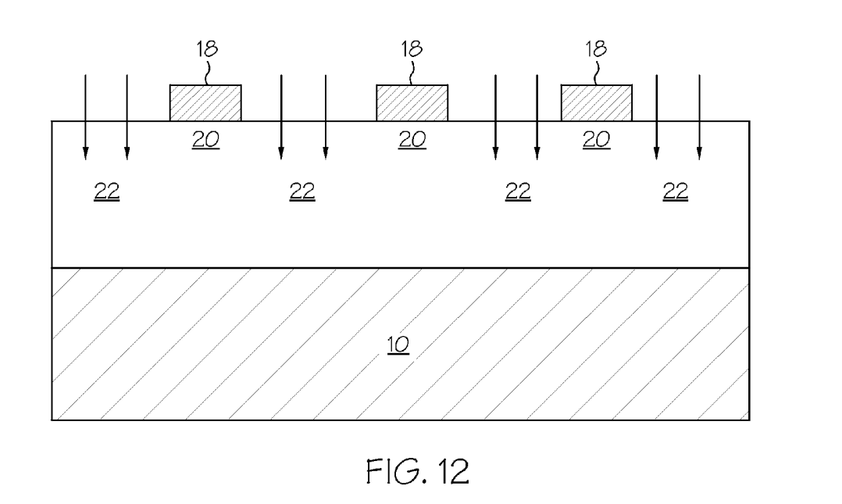
FIGS. 12-16 are cross-sectional views showing an alternate process for nitridation of the copper layer and formation of the copper lines and copper vias in accordance with various embodiments.
Figure 13:
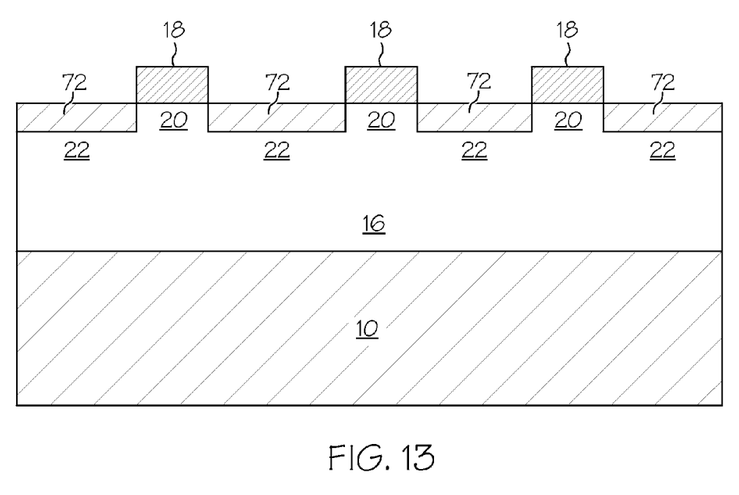
Figure 14:
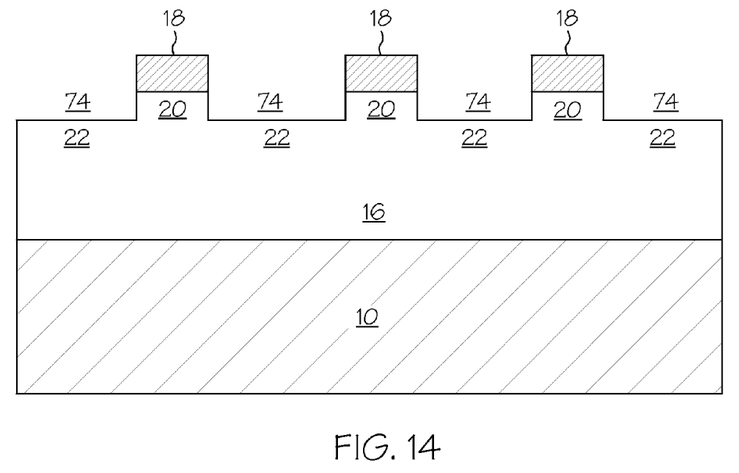
Figure 15:
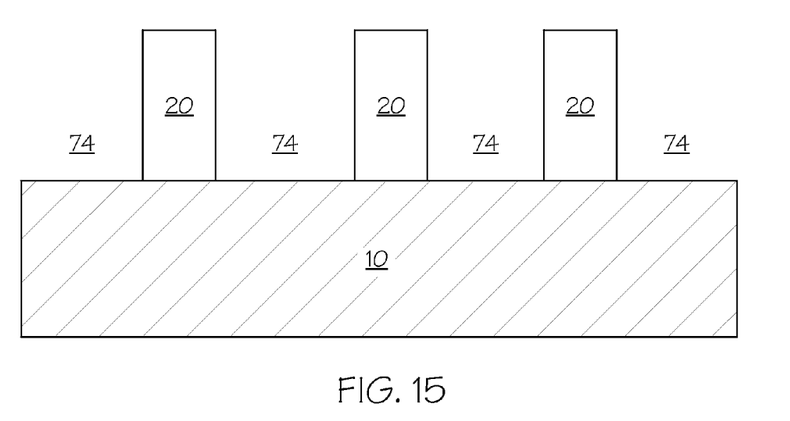
Figure 16:
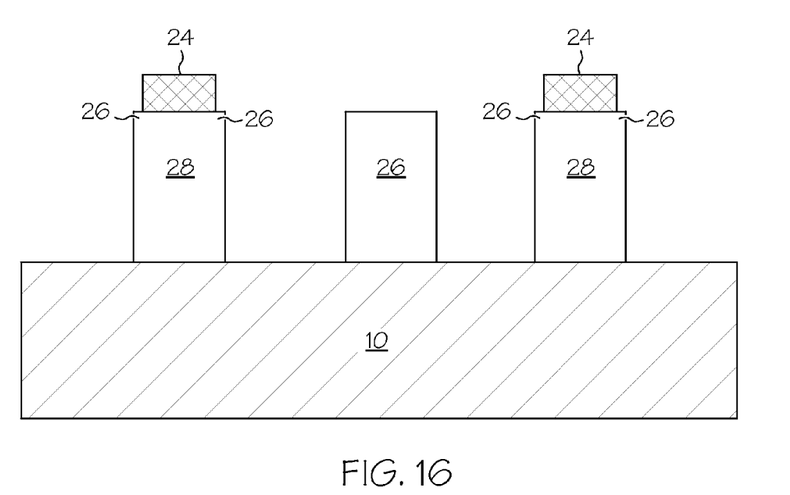

Referring now to FIG. 12, an alternate process for nitriding copper layers 16, 64 is illustrated. After forming the line masks 18 defining masked areas 20 and unmasked areas 22, nitriding is performed by nitrogen/ammonia plasma nitridation. Unlike the ion implantation discussed above and illustrated in FIG. 3, the plasma nitridation process of FIG. 12 nitrides to shallower depths. Therefore, repeated cycles of alternating nitridation and etching are required. As shown in FIG. 13, after a first plasma nitridation process, the unmasked area 22 is nitrided to a shallow depth to form pockets 72 of nitrided copper. As shown in FIG. 14, these pockets 72 are then etched, such as by HCl gas or by wet etching with an HCl solution, creating voids 74 in the copper layer 16. The nitriding and etching processes are repeated until the unmasked areas 72 are completely etched away as in FIG. 15. Then, via masks 24 are patterned, as in FIG. 16, creating unmasked portions 26 and masked portions 28 of the copper layer 16. The plasma nitridation and etching cycles are repeated to form the copper lines 30 and copper vias of FIG. 7.

To briefly summarize, the fabrication methods described herein form a copper layer on a substrate, and then nitride and etch the copper to simultaneously form copper lines and copper vias. No trenches are formed; rather, copper material surrounding the copper lines and copper vias is nitrided and removed, leaving the copper lines and copper vias. Further, the copper layer is modified, such as through annealing, to cause grain growth to an average grain size of more than about 0.05 microns, such as about 0.10 microns. The fabrication methods herein avoid problems associated with conventional damascene processes, provide enhanced electromigration reliability, provide chamfer angles between lines and vias of about 90 degrees, and do not damage low-k dielectric due to sputtering or etching.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A copper interconnect fabricated on an FEOL processed substrate, the copper interconnect comprising:
   a first copper layer comprising a copper line and a copper via, wherein the copper line is formed on the FEOL processed substrate, wherein the copper via extends upward from the copper line and has a top surface and side surfaces, and wherein the copper via and a portion of the copper line are formed from a single crystal;
   a barrier layer on the copper line and the side surfaces of the via;
   a dielectric material overlying the FEOL processed substrate and the barrier layer on the copper line, and surrounding the barrier layer on the copper via;
   a manganese silicate interlayer material overlying the dielectric material;
   a metallic manganese cap portion on the copper via; and
   a second copper layer formed from copper overlying the cap portion and the interlayer material.

2. The copper interconnect of claim 1 wherein the interlayer conductor is metallic manganese and wherein the interlayer material is a manganese silicate.

3. The copper interconnect of claim 1 wherein the copper line is formed with an average crystal size of larger than about 0.05 microns.

4. The copper interconnect of claim 1 wherein the copper line is formed with an average crystal size of about 0.1 microns.

5. The copper interconnect of claim 1 wherein the portion of the copper line is bound by crystal boundaries substantially perpendicular to the copper line.

6. The copper interconnect of claim 1 wherein the copper via extends upward from the copper line at an angle of about 90 degrees.

7. The copper interconnect of claim 1 wherein the barrier layer is chosen from the group comprising cobalt, titanium, ruthenium, tantalum nitride, manganese, or combinations thereof.

8. The copper interconnect of claim 1 wherein the first copper layer is formed by physical vapor deposition.

9. The copper interconnect of claim 1 wherein the first copper layer has a crystal orientation of (111).

10. The copper interconnect of claim 1 wherein the barrier layer includes manganese silicide.

11. A semiconductor device comprising:
    a substrate:
    a first copper layer including crystal boundaries and comprising a copper line and a copper via, wherein the copper line is formed on the substrate, wherein the copper via extends upward from the copper line, and no crystal boundaries separate the copper via and the copper line;

a dielectric material overlying the substrate and surrounding the copper via;

a manganese silicate interlayer material overlying the dielectric material;

a metallic manganese cap portion on the copper via; and a second copper layer overlying the cap portion and the interlayer material.

12. The copper interconnect of claim 11 wherein the interlayer conductor is metallic manganese and wherein the interlayer material is a manganese silicate.

13. The copper interconnect of claim 11 wherein the copper line is formed with an average crystal size of larger than about 0.05 microns.

14. The copper interconnect of claim 11 wherein the copper line is formed with an average crystal size of about 0.1 microns.

15. The copper interconnect of claim 11 wherein the crystal boundaries extend within the copper line substantially perpendicular to the copper line.

16. The copper interconnect of claim 11 wherein the copper via extends upward from the copper line at an angle of about 90 degrees.

17. The copper interconnect of claim 11 wherein the first copper layer has a crystal orientation of (111).

* * * * *